United States Patent [19]

Maracas et al.

[11] Patent Number: 5,725,788
[45] Date of Patent: Mar. 10, 1998

[54] APPARATUS AND METHOD FOR PATTERNING A SURFACE

[75] Inventors: George N. Maracas, Phoenix; Ronald N. Legge, Scottsdale; Herbert Goronkin, Tempe; Lawrence N. Dworsky, Scottsdale, all of Ariz.

[73] Assignee: Motorola, Schaumburg, Ill.

[21] Appl. No.: 608,022

[22] Filed: Mar. 4, 1996

[51] Int. Cl.$^6$ ........................................ B44C 1/22
[52] U.S. Cl. ........................... 216/41; 216/11; 216/39; 216/47; 216/49; 216/51; 156/345
[58] Field of Search ........................... 216/11, 39, 41, 216/47, 49, 51; 430/5, 296; 156/659.11, 661.11, 345

[56] References Cited

U.S. PATENT DOCUMENTS

| | | | |
|---|---|---|---|
| 5,053,318 | 10/1991 | Gulla et al. ........................... | 216/51 X |
| 5,275,689 | 1/1994 | Felten et al. ........................... | 216/49 X |
| 5,527,662 | 6/1996 | Hashimoto et al. ........................... | 216/47 X |

*Primary Examiner*—William Powell
*Attorney, Agent, or Firm*—Eugene A. Parsons

[57] ABSTRACT

An apparatus (95) and method for patterning a surface of an article (30), the apparatus (95) including a large-area stamp (50) for forming a self-assembled monolayer (36) (SAM) of a molecular species (38) on the surface (34) of a layer (32) of resist material, which is formed on the surface of the article (30). The large-area stamp (50) includes a layer (52) of an elastomer and has, embedded within it, mechanical structures (68, 80) which stiffen the large-area stamp (50) and deform it to control the stamped patterns. The method includes the steps of: forming a layer (32) of resist material is on the surface of the article (30), utilizing the large-area stamp (50) to form the SAM (36) on the surface (34) of the layer (32) of resist material, etching the layer (32) of resist material, and thereafter etching or plating the surface of the article (30).

40 Claims, 6 Drawing Sheets

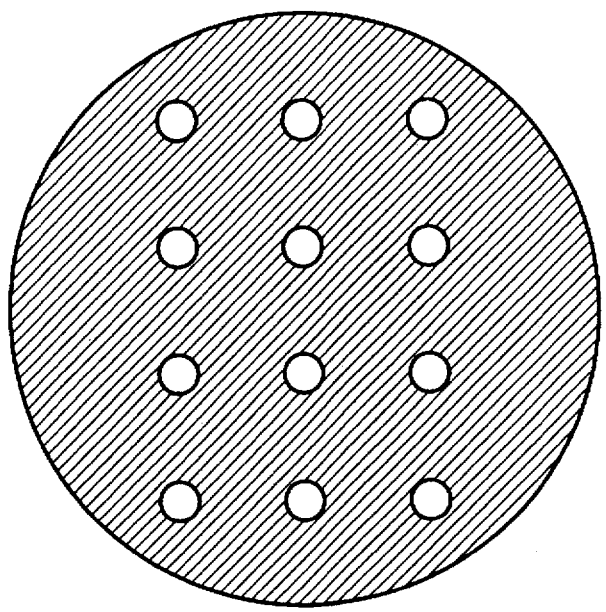
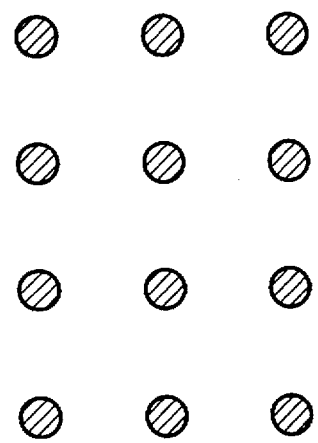
*FIG. 8*  *FIG. 9*
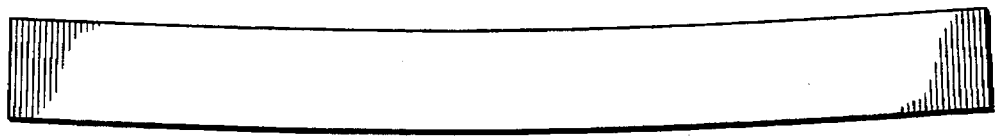
 50  *FIG. 11*
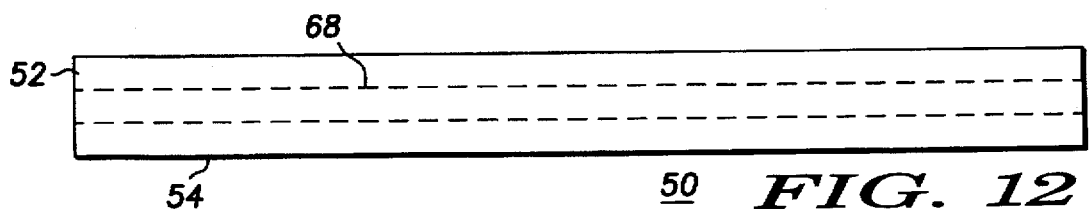
*FIG. 12*
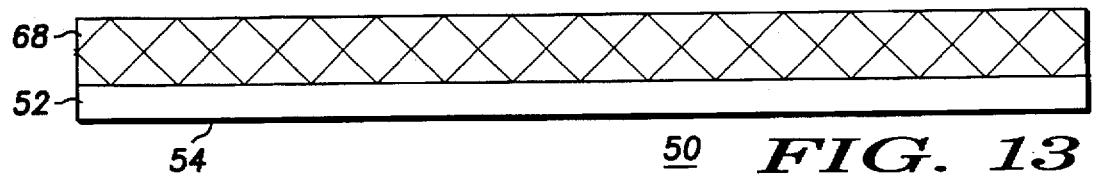
*FIG. 13*
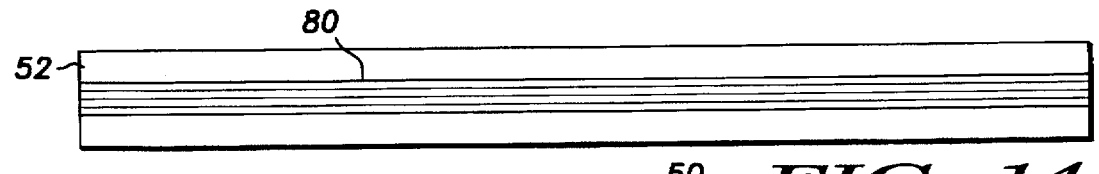
*FIG. 14*

APPARATUS AND METHOD FOR PATTERNING A SURFACE

FIELD OF THE INVENTION

The present invention pertains to the areas of microelectronic devices, sensors, and optical elements and more particularly to a method for patterning large-area surfaces having surface areas of 1 in$^2$ or greater.

BACKGROUND OF THE INVENTION

Prior art methods of patterning (etching or plating) surfaces with micron or submicron features include irradiative lithographic methods such as photolithography, electron-beam lithography, and x-ray lithography. Each of these methods is time-consuming and requires the use of costly, high maintenance capital equipment. The equipment used in conventional irradiative lithographic methods do not easily form large-area devices; they are limited to the patterning of small areas which must subsequently be stitched together if a large-area device is to be fabricated. Typically, the largest field that can presently be patterned by a panel printer, such as that produced by MRS, has an area of about 12 in$^2$, and a typical photolithographic stepper for semiconductor applications has a field having an area on the order of 1 in$^2$.

As an example, field emission displays utilize arrays of field emission devices, which are well known in the art. One example of a structure and method of fabrication of a field emission device is taught in the U.S. Pat. No. 3,789,471 and entitled "Field Emission Cathode Structures, Devices Utilizing Such Structures, and Methods of Producing Such Structures" issued Feb. 5, 1974, which patent is incorporated herein by reference. In order to form the emitter wells and pattern the conductive rows and columns of the device, conventional photolithographic methods are employed. The dimensions of the array of field emission devices in a field emission display can be relatively large. For example, a display diagonal of 10.25 inches is a realistic value for a final product display. Available photolithographic equipment, or steppers, must pattern a multitude of fields which are stitched together in order to provide the required device dimensions of the display. Each stepper costs on the order of 5 million dollars, and the stitching process is quite time-consuming.

Accordingly, there exists a need for an improved method of patterning a surface with micron or sub micron features which utilizes low-cost, low-maintenance capital equipment and which quickly, easily, and reproducibly patterns large-area devices, thereby providing high throughput.

Micro-contact printing of self-assembled molecular monolayers (SAMs) is known in the art. The SAMs are comprised of molecules which have a functional group that binds to certain types of solids, and the remainder of the molecule interacts with neighboring molecules to form a dense structure. Current micro-contact printing methods cannot reliably or reproducibly print surfaces. This deficiency in the prior art is most pronounced in the printing of large-area surfaces having surface areas greater than about 1 in$^2$.

Accordingly, a general purpose of the present invention is to provide a cost-effective, reproducible method for patterning large-area surfaces.

BRIEF DESCRIPTION OF THE DRAWINGS

Referring to the drawings:

FIG. 8 is a top plan view of a first predetermined pattern defined by the contacting surfaces of the large-area stamp of FIG. 7.

FIG. 9 is a top plan view of a second predetermined pattern defined by the indentations of the large-area stamp of FIG. 7.

FIG. 11 is a side elevational view of another embodiment of a large-area stamp in accordance with the present invention.

FIGS. 12–14 are side elevational views of alternative embodiments of a large-area stamp in accordance with the present invention.

DESCRIPTION OF THE PREFERRED EMBODIMENTS

Figure 1:
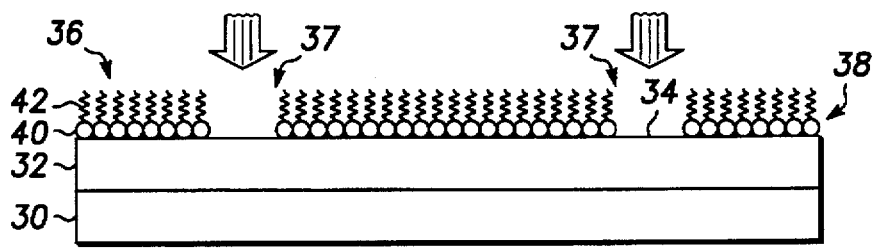
FIGS. 1–6 are side elevational cross-sectional views of an article and the structures corresponding to the steps for a process of patterning the article utilizing a self-assembled monolayer.
Figure 2:
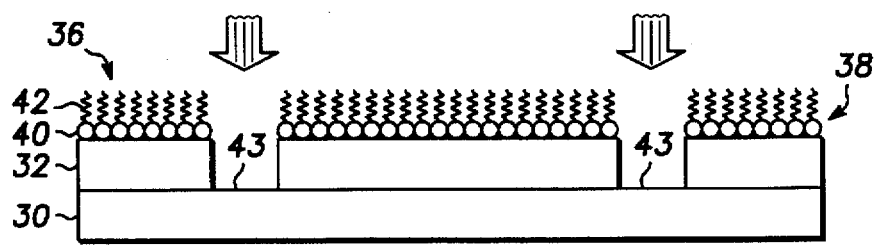
Figure 3:
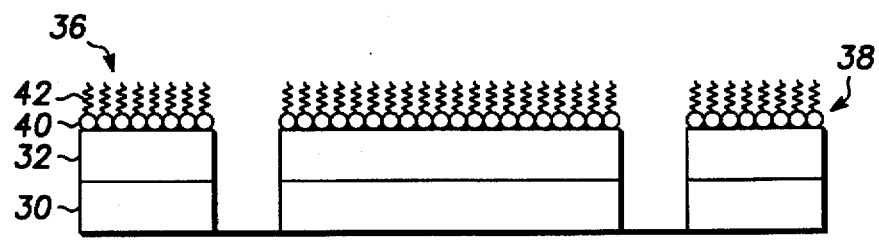
Figure 4:
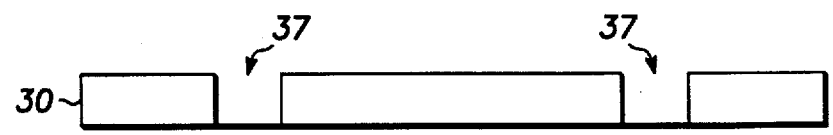
Figure 5:
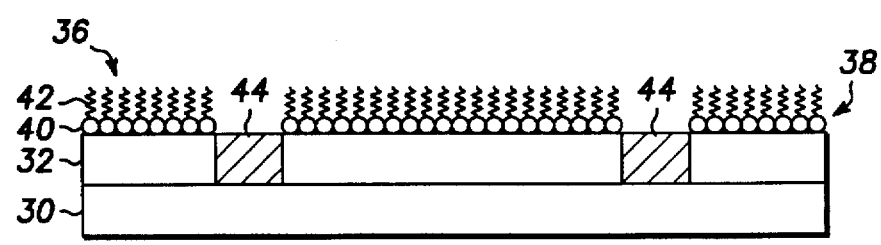
Figure 6:
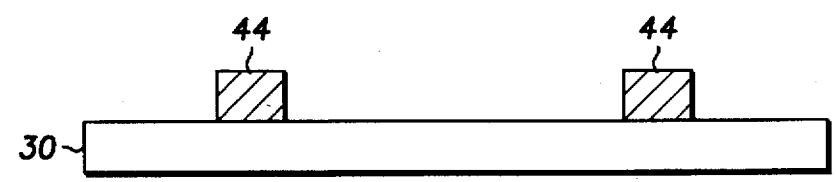

Referring now to FIGS. 1–6 there are depicted the intermediate structures formed when one embodiment of a method for patterning a surface is performed in accordance with the present invention. Illustrated in FIG. 1 are article 30, a layer 32 of resist material, and a self-assembled monolayer (SAM) 36 of a self-assembled monolayer-forming molecular species 38. Article 30 is patterned (etched or plated) by first forming layer 32 of resist material on the surface of article 30 which is to be patterned. Then SAM 36 is formed on an outer surface 34 of layer 32 of resist material. SAM 36 has a first predetermined pattern defined by SAM-forming molecular species 38, and the exposed area of outer surface 34 defines a second predetermined pattern. The exposed area of outer surface 34 is etched by using an etchant which is inert with respect to SAM 36. As schematically illustrated in FIG. 1, SAM-forming molecular species 38 includes two parts: a first functional group 40 binds to outer surface 34 of layer 32 of resist material and a second functional group 42 which forms a dense layer that can physically and/or chemically block the etchant from attacking those portions of outer surface 34 underlying SAM 36. The etchant attacks the exposed area of outer surface 34, as indicated by the arrows in FIG. 1. The structure resulting from the first etching step is illustrated in FIG. 2, which further illustrates the action of a second etchant, depicted by arrows. In order to etch the second predetermined pattern into article 30, an etchant is chosen which is inert with respect to layer 32 of resist material. Prior to this second etch step, SAM 36 can be removed by utilizing an organic solvent. The result of the second etch step is illustrated in FIG. 3. Alternatively, as illustrated in FIG. 5, instead of etching the structure of FIG. 2, a plating material 44 can be plated onto the exposed area of the surface of article 30. Thereafter, layer 32 of resist material is removed so that plating material 44, exhibiting the second predetermined pattern, remains on the surface of article 30. Plating material 44 may be a conductor.

Layer 32 of resist material and SAM-forming molecular species 38 are chosen so that the appropriate binding behavior and etch-resistance of SAM 36 are provided. Additionally, layer 32 of resist material must provide sufficient adhesion to the surface of article 30. A suitable combination includes layer 32 of resist material being formed from a metal being selected from the group consisting of titanium, aluminum, gold, chromium, nickel, copper, and silver, and SAM-forming molecular species 38 includes an alkylthiol, such as hexadecanethiol. Another possible resist/SAM combination includes layer 32 of resist material being formed from a metal being selected from the group consisting of titanium, aluminum, nickel, copper, and chromium or being formed from a dielectric being selected from the group consisting of silicon dioxide, aluminum oxide, and silicon nitride; SAM-forming molecular species 38, in this instance, includes an alkyltrichlorosilane. Another possible resist/SAM combination includes layer 32 of resist material being formed from a dielectric, such as silicon dioxide, aluminum oxide, or silicon nitride, and SAM-forming molecular species 38, in this combination, includes an alkylsiloxane.

SAM organics are readily available from vendors. They are sold in liquid form and are typically diluted to micro molar concentrations in the laboratory. Typical solvents are ethanol and chloroform, but others are possible.

Figure 7:
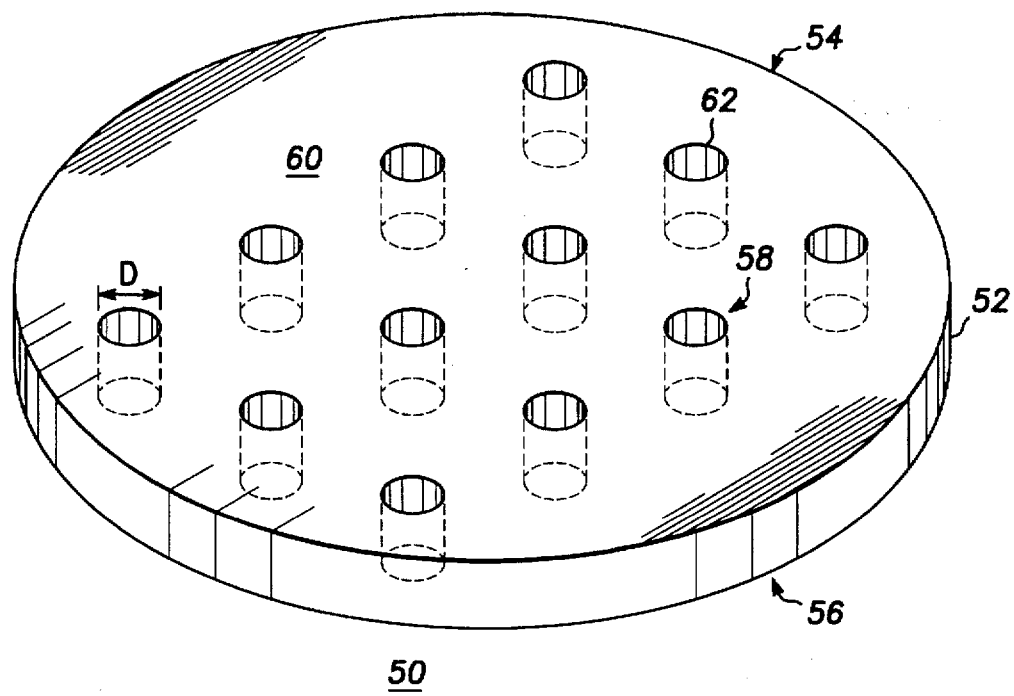
FIG. 7 is an isometric view of an embodiment of a large-area stamp in accordance with the present invention.

Referring now to FIG. 7 there is depicted an isometric view of an embodiment of a large-area stamp 50 in accordance with the present invention. Large-area stamp 50 is utilized to print SAM 36 onto outer surface 34 of layer 32 of resist material so that the article underlying layer 32 can be patterned. Large-area stamp 50 includes a layer 52 of flexible material having a first opposed surface 54 and a second opposed surface 56. First opposed surface 54 include a relief 58, which has a plurality of indentations 62 (also referred to as grooves, holes, or apertures) and a plurality of contacting surfaces 60 positioned between the plurality of indentations 62. First opposed surface 54 has a surface area greater than 1 in$^2$. Many microelectronic devices now include micron or sub-micron features. To form features such as these, indentations 62 have a dimension, D, in the range of 0.1–1000 micrometers. For other applications, dimension D is greater than 1000 micrometers. Layer 52 of flexible material is made from an elastomeric material, such as a polydimethylsiloxane elastomer, which can be purchased from Dow Corning.

Referring now to FIG. 8, there is depicted the first predetermined pattern defined by plurality of contacting surfaces 60. Depicted in FIG. 9 is the second predetermined pattern defined by indentations 62.

Figure 10:
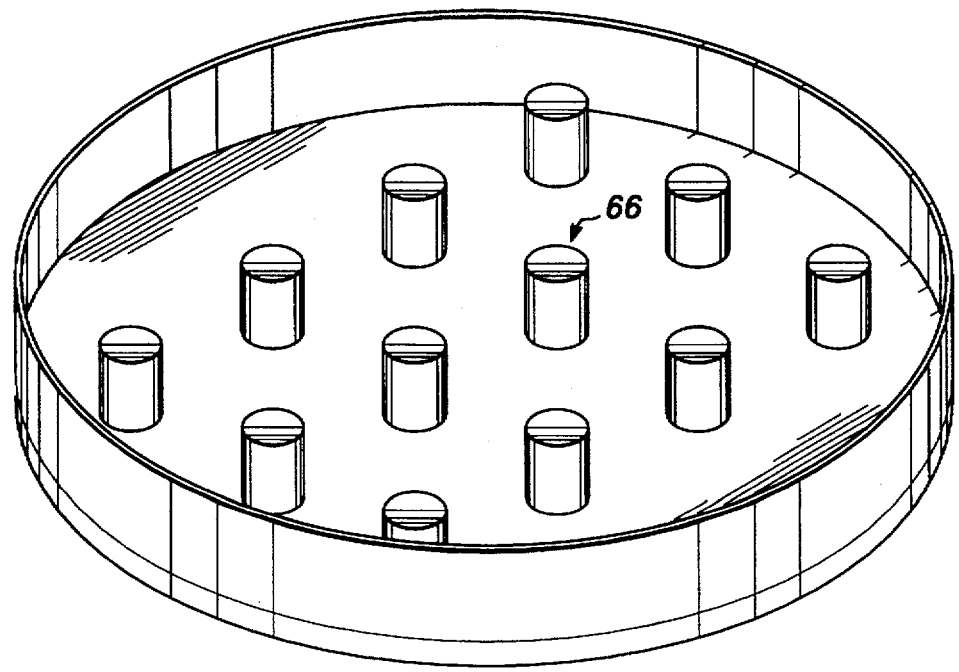
FIG. 10 is an isometric view of an embodiment of a stamp-casting master in accordance with the present invention.

Referring now to FIG. 10, there is depicted an isometric view of a stamp-casting master 64 for forming large-area stamp 50 of FIG. 7, in accordance with the present invention. Stamp-casting master 64 has a complement relief 66, which is the complement of relief 58. A hardenable fluid, the fluid precursor of layer 52 of flexible material, is poured into, or contacted with complement relief 66 of stamp-casting master 64. Then, the hardenable fluid is allowed to harden and thereby form large-area stamp 50, which is thereafter removed from stamp-casting master 64.

Large-area stamp 50 is utilized to apply SAM 36 to outer surface 34 of layer 32 of resist material. In one embodiment of a method for patterning a surface of an article in accordance with the present invention, SAM 36 is formed on outer surface 34 of layer 32 of resist material by first wetting plurality of contacting surfaces 60 with a solution containing SAM-forming molecular species 38, including one of the solvents described above. The solvent is evaporated off of plurality of contacting surfaces 60. Then, large-area stamp 50 is aligned with outer surface 34 of layer 32 of resist material so that the patterning of article 30 is appropriately positioned on article 30 and, if applicable, performed at a predetermined orientation with respect to any preexisting pattern on article 30. Thereafter, plurality of contacting surfaces 60 are contacted with outer surface 34. Large-area stamp 50 is then removed so that SAM 36 remains. SAM-forming molecular species 38 have the first predetermined pattern, and the exposed area of outer surface 34 has the second predetermined pattern. The exposed area of outer surface 34 is then etched with an etchant which is inert with respect to SAM 36. For example, when layer 32 of resist material includes aluminum and SAM-forming molecular species 38 includes an alkylthiol, a suitable etchant is a ferricyanide. This etching step provides an exposed area of the surface of article 30, which is subsequently etched or plated. The suitable chemistries required to perform this subsequent etching or plating step will be known to one skilled in the art. After article 30 has been patterned as described above, layer 32 of resist material is subsequently removed, subjected to further patterning, or allowed to remain on outer surface 34. Article 30, when etched, can be utilized as a mold.

Many patterning applications involve the patterning of a surface having a surface area greater than 1 in$^2$. Large-area stamp 50 is utilized to allow simultaneous patterning of the entire surface and thereby avoid a stitching process, which is required by prior-art, large-area patterning methods. In these types of applications, and in accordance with the present invention, an embodiment of large-area stamp 50 includes first opposed surface 54 having an area at least equal to the surface area of the surface to be patterned. The flexibility of large-area stamp 50 causes large-area stamp 50 to bow under its own weight when immovably fixed at the edges. Referring now to FIG. 11, there is depicted the bowing that occurs to large-area stamp 50 as is deforms under its own weight, represented by the downward arrow. Also, during the contacting step, wherein plurality of contacting surfaces 60 is contacted with outer surface 34 of layer 32 of resist material, spatial variations in stamping pressure can cause deformation of the first and second predetermined patterns, if no additional structural support is provided within layer 52 of flexible material.

Referring now to FIGS. 12 and 13 there are depicted two embodiments of large-area stamp 50 in accordance with the present invention. In the embodiment of FIG. 12, a stiffening agent 68, which includes rigid meshes, stiff rods, and/or interlaced stiff fibers, is disposed within layer 52 of flexible material. Stiffening agent 68 is located a sufficient distance away from first opposed surface 54 so that the contouring properties of first opposed surface 54 are not degraded by stiffening agent 68. Stiffening agent 68 provides structural support to maintain the first and second predetermined patterns of large-area stamp 50. Rigid meshes, stiff rods, and interlaced stiff fibers are readily available or can be formed by methods commonly known in the art. In the embodiment of FIG. 13, stiffening agent 68 includes a stiffening chemical dispersed within layer 52 of flexible material at a sufficient distance from first opposed surface 54 so that the contouring properties of first opposed surface 54 are not degraded. The choice of stiffening chemical will be apparent to one skilled in the art; stiffening additives and the techniques for dispersing them within elastomeric materials and other flexible materials are known by those skilled in the art.

Figure 15:
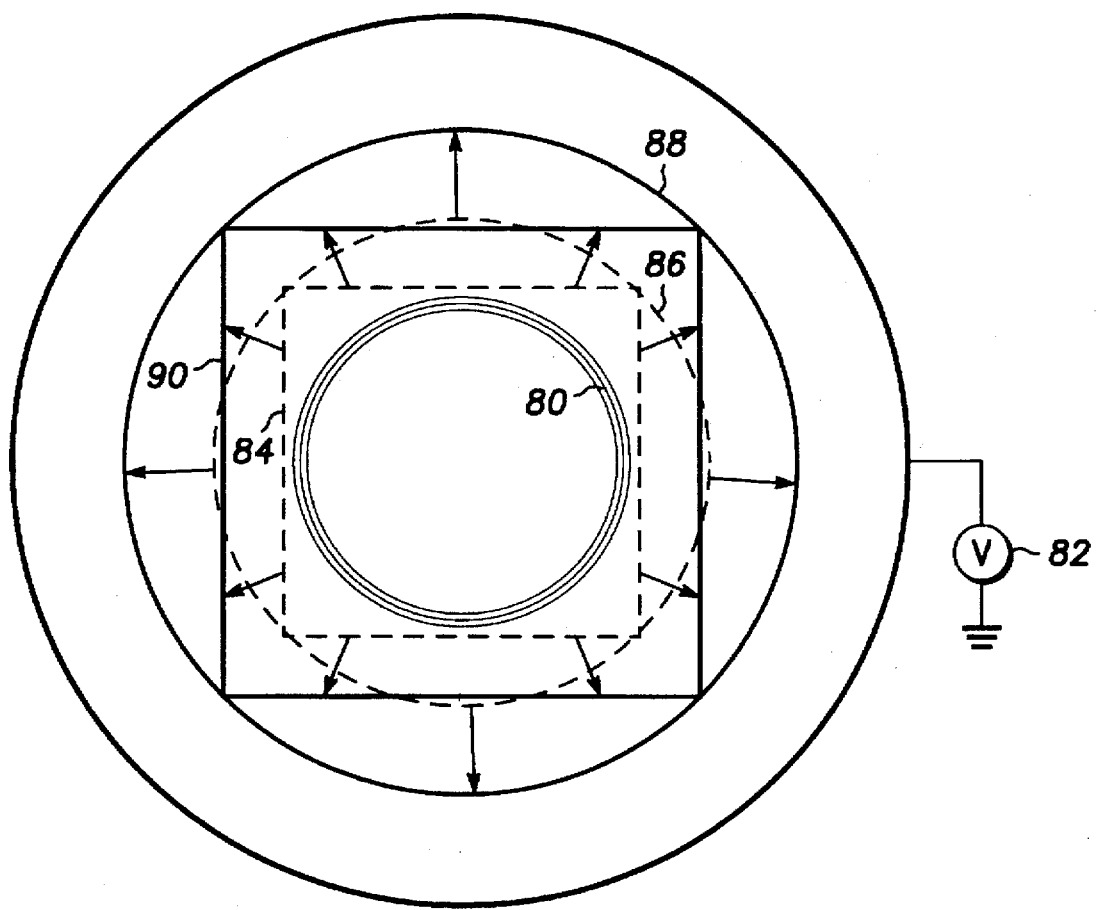
FIG. 15 is a schematic, top plan view of the embodiment of FIG. 14 being stretched by an applied voltage source.

Referring now to FIGS. 14 and 15, there is depicted another embodiment of large-area stamp 50 in accordance with the present invention. In this particular embodiment, large area stamp 50 includes a ring 80 formed by a plurality of piezoelectric structures, including a plurality of piezoelectric crystals, embedded within layer 52 of flexible material. In another embodiment of large-area stamp 50, the plurality of piezoelectric structures forms a disk. Ring 80 of piezoelectric crystals is utilized to deform large-area stamp 50 to control and maintain the first and second predetermined patterns. As illustrated in FIG. 15, by applying an appropriate voltage 82 to large-area stamp 50 having plurality of piezoelectric structures 80, corrective mechanical forces are provided which stretch large-area stamp 50. In FIG. 15 an initial, uncorrected large-area stamp 86 having an initial pattern 84 is stretched to form a final, corrected large-area stamp 88 having a final pattern 90.

Figure 16:
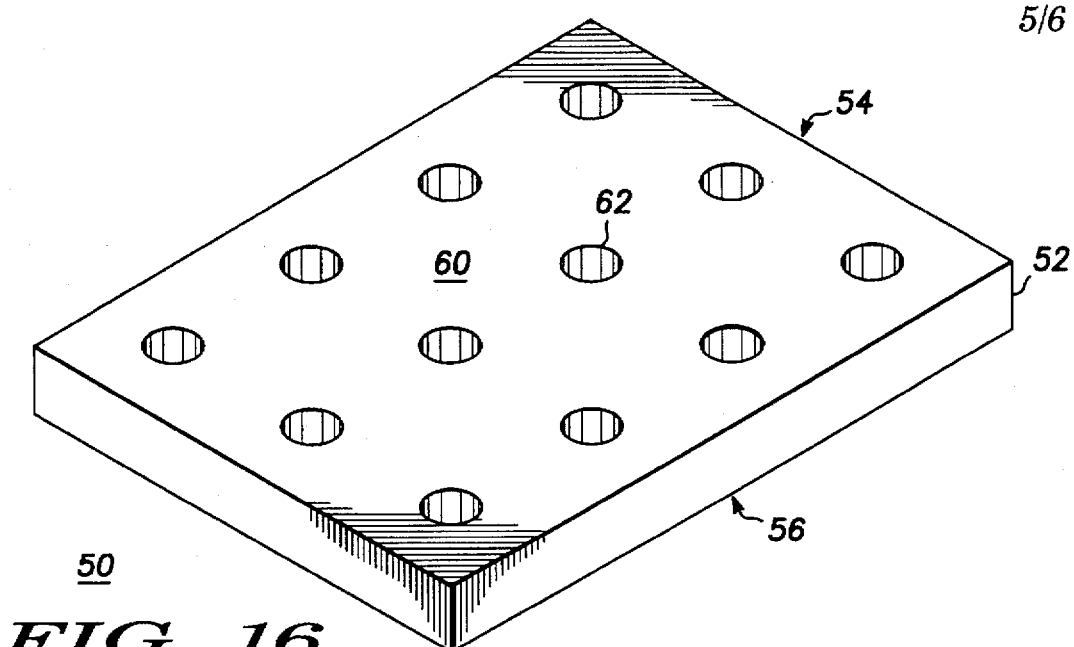
FIG. 16 is an isometric view of another embodiment of a large-area stamp in accordance with the present invention.
Figure 17:
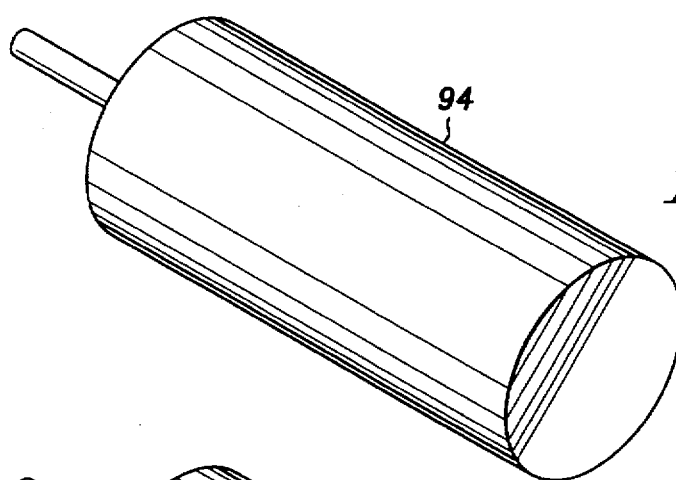
FIGS. 17 and 18 are isometric views of a hard cylinder and the combination of the large-area stamp of FIG. 16 with the cylinder of FIG. 18 in accordance with the present invention.
Figure 18:
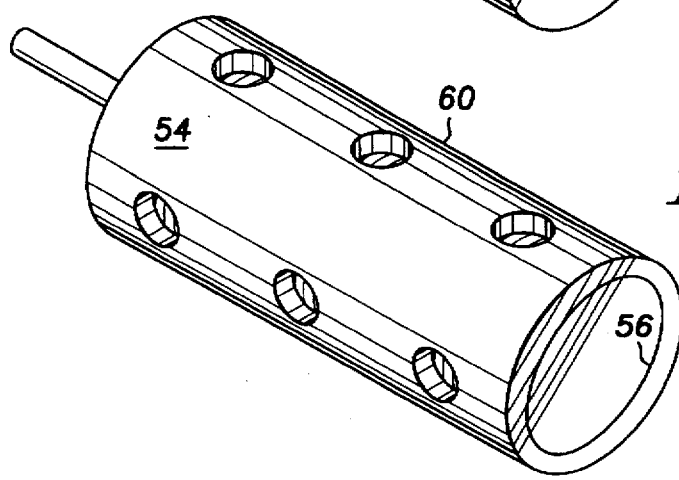

Referring now to FIGS. 16–18 there are depicted the constituent parts and final structure of another embodiment of large-area stamp 50 in accordance with the present invention. In this particular embodiment, large-area stamp 50 includes a hard cylinder 92 having an outer surface 94 as illustrated in FIG. 17. Layer 52 of flexible material is attached to hard cylinder 92 by affixing second outer surface 56 of layer 52 of flexible material to outer surface 94 of hard cylinder 92. In this particular embodiment, layer 52 may partially cover outer surface 94 or it may be affixed continuously over the entire circumference of hard cylinder 92 so that plurality of contacting surfaces 60 makes continuous contact with outer surface 34 of layer 32 of resist material when hard cylinder 92 is repeatedly rolled over outer surface 34.

Figure 19:
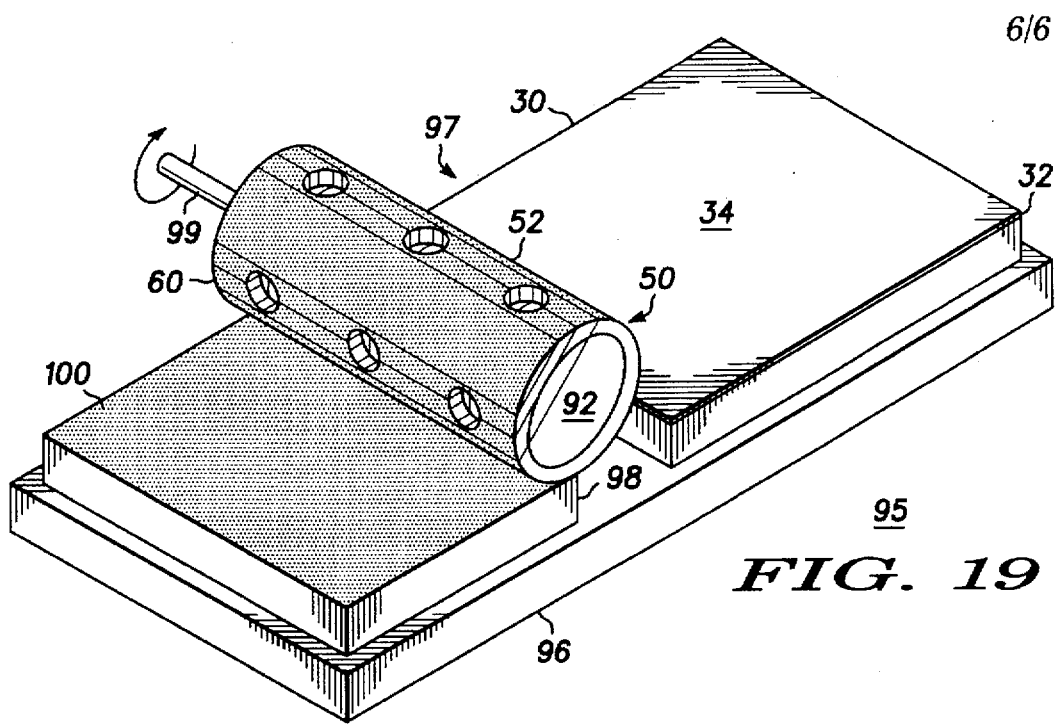
FIG. 19 is an isometric view of an embodiment of an apparatus for applying a self-assembled monolayer of a molecular species to a surface of an article in accordance with the present invention.

Referring now to FIG. 19, there is depicted an embodiment of an apparatus 95 for applying self-assembled monolayer 36 to outer surface 34 of layer 32 of resist material in accordance with the present invention. In this particular embodiment, apparatus 95 includes a support structure 96 having a surface designed to hold a substrate 97 which includes article 30 and layer 32. Also included in apparatus 95 is a sponge-like substrate 98, which is saturated with a solution 100 containing SAM-forming molecular species 38. Apparatus 95 further includes a rotatable, translatable arm 99 on the end of which is positioned the embodiment of large-area stamp 50 depicted in FIG. 18. Large-area stamp 50 is disposed above support structure 96 so that plurality of contacting surfaces 60 can be rolled over and contacted with both sponge-like substrate 98 and outer surface 34 of layer 32 of resist material. Arm 99 rotates and translates large-area stamp 50 over sponge-like substrate 98 to wet plurality of contacting surfaces 60 with solution 100. Then, large-area stamp 50 is rolled over outer surface 34 so that plurality of contacting surfaces 60 make physical contact with outer surface 34 thereby forming SAM 36 on outer surface 34.

Figure 20:
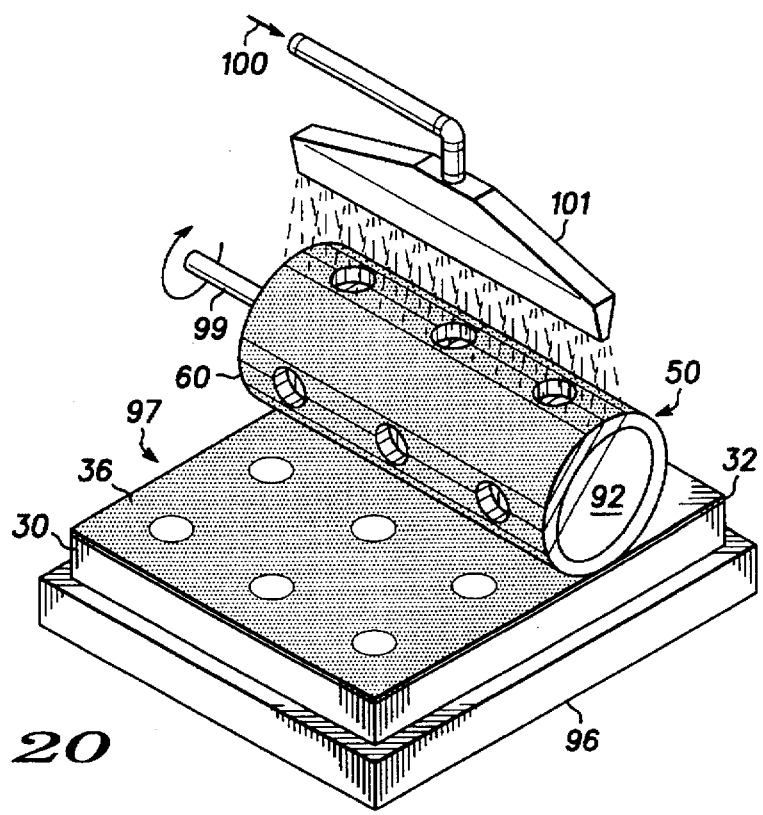
FIG. 20 is an isometric view of another embodiment of an apparatus for applying a self-assembled monolayer of a molecular species to a surface of an article in accordance with the present invention.

Referring now to FIG. 20 there is depicted another embodiment of apparatus 95 for applying self-assembled monolayer 36 to outer surface 34 of layer 32 of resist material in accordance with the present invention. This particular embodiment of apparatus 95 includes a brush or spray which wets a portion of plurality of contacting surfaces 60 while another portion of plurality of contacting surfaces 60 contacts outer surface 34 to form SAM 36. In this manner, the steps of wetting plurality of contacting surfaces 60 and contacting plurality of contacting surfaces 60 with outer surface 34 can be performed simultaneously as large-area stamp 50 is rolled over substrate 97 by the action of arm 99.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

We claim:

1. A method for patterning a surface of an article comprising the steps of:

providing a layer of flexible material having first and second opposed surfaces;

forming a relief in the first opposed surface of the layer of flexible material, the relief having a plurality of contacting surfaces defining a first pattern, the relief including an indentation defining a second pattern;

wetting the plurality of contacting surfaces with a solution containing a self-assembled monolayer-forming molecular species thereby providing a wetted plurality of contacting surfaces;

forming on the surface of the article a layer of resist material having an outer surface to which the self-assembled monolayer-forming molecular species binds;

thereafter contacting the wetted plurality of contacting surfaces with the outer surface of the layer of resist material;

thereafter removing the plurality of contacting surfaces thereby forming a self-assembled monolayer of the self-assembled monolayer-forming molecular species on the outer surface of the layer of resist material and thereby providing an exposed area of the outer surface of the resist material having the second pattern; and etching the exposed area of the outer surface of the resist material with an etchant which is inert with respect to the self-assembled monolayer thereby providing an exposed area of the surface of the article having the second pattern.

2. A method for patterning a surface of an article as claimed in claim 1 wherein the self-assembled monolayer covers at least 1 $in^2$ of the outer surface of the layer of resist material so that at least 1 $in^2$ of the surface of the article is patterned.

3. A method for patterning a surface of an article as claimed in claim 1 wherein the step of forming a relief in the first opposed surface of the layer of flexible material includes forming an indentation having a dimension in the range of 0.1 to 1000 micrometers.

4. A method for patterning a surface of an article as claimed in claim 1 wherein the relief has a complement relief and wherein the step of forming a relief in the first opposed surface of the layer of flexible material includes the steps of:

providing a stamp-casting master having the complement relief;

contacting a hardenable fluid with the complement relief of the stamp-casting master;

allowing the hardenable fluid to harden thereby forming a stamp; and removing the stamp from the stamp-casting master.

5. A method for patterning a surface of an article as claimed in claim 4 wherein the step of contacting a hard-enable fluid with the second relief includes contacting a precursor of an elastomer with the second relief thereby forming an elastomeric stamp.

6. A method for patterning a surface of an article as claimed in claim 5 wherein the elastomer includes a polydimethylsiloxane elastomer.

7. A method for patterning a surface of an article as claimed in claim 1 wherein the step of wetting the plurality of contacting surfaces includes wetting the plurality of contacting surfaces with a solution containing an alkylthiol.

8. A method for patterning a surface of an article as claimed in claim 7 wherein the layer of resist material is a metal being selected from the group consisting of titanium, aluminum, gold, chromium, nickel, copper, and silver.

9. A method for patterning a surface of an article as claimed in claim 7 wherein the alkylthiol includes hexadecanethiol.

10. A method for patterning a surface of an article as claimed in claim 1 wherein the step of wetting the plurality of contacting surfaces includes wetting the plurality of contacting surfaces with a solution containing an alkyltrichlorosilane.

11. A method for patterning a surface of an article as claimed in claim 10 wherein the layer of resist material is a dielectric being selected from the group consisting of silicon dioxide, aluminum oxide, and silicon nitride.

12. A method for patterning a surface of an article as claimed in claim 10 wherein the layer of resist material is a metal being selected from the group consisting of titanium, aluminum, nickel, copper, and chromium.

13. A method for patterning a surface of an article as claimed in claim 1 wherein the step of wetting the plurality of contacting surfaces includes wetting the plurality of contacting surfaces with a solution containing an alkylsiloxane.

14. A method for patterning a surface of an article as claimed in claim 13 wherein the step of forming on the surface of the article a layer of resist material includes forming on the surface of the article a layer of a dielectric.

15. A method for patterning a surface of an article as claimed in claim 14 wherein the dielectric is selected from the group consisting of silicon dioxide, aluminum oxide, and silicon nitride.

16. A method for patterning a surface of an article as claimed in claim 1 further including the subsequent step of etching the exposed area of the surface of the article with a chemical etchant which is inert with respect to the layer of resist material.

17. A method for patterning a surface of an article as claimed in claim 16 further including the subsequent step of removing the layer of resist material.

18. A product made by the method of claim 17 suitable for use as a mold.

19. A method for patterning a surface of an article as claimed in claim 1 further including the subsequent steps of:
plating the exposed area of the surface of the article with a plating material; and
thereafter removing the resist material so that the plating material remains on the surface having the second pattern.

20. A method for patterning a surface of an article as claimed in claim 19 wherein the plating material is a conductor.

21. A large-area stamp for applying a self-assembled monolayer of a molecular species to an outer surface of a layer of resist material having a surface area greater than 1 in$^2$, the large-area stamp comprising:
a layer of a flexible material having first and second opposed surfaces, the first opposed surface having a surface area greater than 1 in$^2$; and
a relief being formed in the first opposed surface of the layer of flexible material, the relief having a plurality of contacting surfaces defining a first pattern and an indentation defining a second pattern.

22. A large-area stamp as claimed in claim 21 wherein the indentation has a dimension in the range of 0.1 to 1000 micrometers.

23. A large-area stamp as claimed in claim 21 wherein the first surface of the layer of flexible material has contouring properties and further including a stiffening agent being disposed within the layer of flexible material at a sufficient distance from the first opposed surface so that the contouring properties of the first surface are not degraded by the stiffening agent
wherein the stiffening agent provides structural support to maintain the first and second patterns in the first opposed surface of the layer of flexible material.

24. A large-area stamp as claimed in claim 23 wherein the stiffening agent includes a structure selected from the group consisting of rigid meshes, stiff rods, and interlaced stiff fibers.

25. A large-area stamp as claimed in claim 23 wherein the stiffening agent includes a stiffening chemical being dispersed within the layer of flexible material at a sufficient distance from the first surface so that the contouring properties of the first surface are not degraded by the stiffening agent.

26. A large-area stamp as claimed in claim 21 wherein the flexible material includes an elastomeric material.

27. A large-area stamp as claimed in claim 26 wherein the elastomeric material includes a polydimethylsiloxane elastomer.

28. A large-area stamp as claimed in claim 21 further including a plurality of piezoelectric structures being embedded in the layer of flexible material
wherein the first and second patterns can be maintained and controlled by providing corrective mechanical forces within the large-area stamp when an appropriate corrective voltage is applied to the large-area stamp having the plurality of piezoelectric structures.

29. A large-area stamp as claimed in claim 28 wherein the plurality of piezoelectric structures include a plurality of piezoelectric crystals.

30. A large-area stamp as claimed in claim 28 wherein the plurality of piezoelectric structures define a ring.

31. A large-area stamp as claimed in claim 28 wherein the plurality of piezoelectric structures define a disk.

32. A large-area stamp as claimed in claim 21 further including a hard cylinder having an outer surface, the second surface of the layer of flexible material being affixed to the outer surface of the hard cylinder.

33. A large-area stamp as claimed in claim 32 wherein the layer of flexible material is affixed to the outer surface continuously over the entire circumference of the hard cylinder so that the plurality of contacting surfaces makes continuous contact with the outer surface of the layer of resist material when the hard cylinder is repeatedly rolled over the outer surface of the layer of resist material.

34. A method for applying a self-assembled monolayer of a molecular species to an outer surface of a layer of resist material, the method including the steps of:
providing a layer of flexible material having first and second opposed surfaces;

forming a relief in the first opposed surface of the layer of flexible material so that the relief includes a plurality of contacting surfaces defining a first pattern and an indentation defining a second pattern thereby forming a large-area stamp;

wetting the plurality of contacting surfaces of the large-area stamp with a solution containing a self-assembled monolayer-forming molecular species;

aligning the large-area stamp with the outer surface of the layer of resist material;

contacting the plurality of contacting surfaces of the large-area stamp with the outer surface of the layer of resist material; and removing the large-area stamp from the outer surface of the layer of resist material thereby forming a self-assembled monolayer of the molecular species on the outer surface of the layer of resist material, the self-assembled monolayer having the first pattern.

35. A method for applying a self-assembled monolayer of a molecular species to an outer surface of a layer of resist material as claimed in claim 34 wherein the self-assembled monolayer covers at least 1 in$^2$ of the outer surface of the layer of resist material.

36. A method for applying a self-assembled monolayer of a molecular species to an outer surface of a layer of resist material as claimed in claim 34 wherein the step of forming a relief in the first opposed surface of the layer of flexible material includes forming an indentation having a dimension in the range of 0.1 to 1000 micrometers.

37. A method for applying a self-assembled monolayer of a molecular species to an outer surface of a layer of resist material as claimed in claim 34, the method further including the steps of:

providing a hard cylinder having an outer surface; and affixing the second opposed surface of the layer of flexible material to the outer surface of the hard cylinder wherein the step of contacting the plurality of contacting surfaces of the large-area stamp with the outer surface of the layer of resist material includes rolling the hard cylinder over the outer surface of the layer of resist material so that the plurality of contacting surfaces makes physical contact with the outer surface of the layer of resist material.

38. A method for applying a self-assembled monolayer of a molecular species to an outer surface of a layer of resist material as claimed in claim 37 wherein the step of affixing the second surface of the layer of flexible material to the outer surface of the hard cylinder includes affixing the layer of flexible material continuously over the entire circumference so that the plurality of contacting surfaces makes continuous contact with the outer surface of the layer of resist material when the hard cylinder is repeatedly rolled over the outer surface of the layer of resist material.

39. An apparatus for applying a self-assembled monolayer of a molecular species to an outer surface of a layer of resist material, the apparatus including:

a hard cylinder having an outer surface;

a layer of a flexible material having first and second opposed surfaces, the second opposed surface being affixed to the outer surface of the hard cylinder;

a relief being formed in the first opposed surface of the layer of flexible material, the relief including an indentation and having a plurality of contacting surfaces defining a first pattern, the indentation defining a second pattern;

means for rotating the hard cylinder;

a support structure designed to hold a substrate having the layer of resist material, the hard cylinder being disposed above the support structure so that the hard cylinder can be rolled over the outer surface of the layer of resist material after the substrate is positioned on the support structure; and means for wetting a portion of the plurality of contacting surfaces with a solution containing a self-assembled monolayer-forming chemical species.

40. An apparatus as claimed in claim 39 wherein the indentation has a dimension in the range of 0.1 to 1000 micrometers.

* * * * *